(12) United States Patent
Zhou et al.

(10) Patent No.: US 10,037,072 B2
(45) Date of Patent: Jul. 31, 2018

(54) CHIP POWER SUPPLY METHOD AND CHIP

(71) Applicant: CAPITAL MICROELECTRONICS CO., LTD., Beijing (CN)

(72) Inventors: Xueping Zhou, Beijing (CN); Zixian Chen, Beijing (CN); Qinghua Xue, Beijing (CN)

(73) Assignee: CAPITAL MICROELECTRONICS CO., LTD., Beijing (CN)

( * ) Notice: Subject to any disclaimer, the term of this patent is extended or adjusted under 35 U.S.C. 154(b) by 0 days.

(21) Appl. No.: 14/904,442

(22) PCT Filed: Jun. 15, 2015

(86) PCT No.: PCT/CN2015/081472
§ 371 (c)(1),
(2) Date: Jan. 12, 2016

(87) PCT Pub. No.: WO2016/201607
PCT Pub. Date: Dec. 22, 2016

(65) Prior Publication Data
US 2017/0168549 A1    Jun. 15, 2017

(51) Int. Cl.
*G06F 1/00* (2006.01)
*G06F 1/32* (2006.01)

(52) U.S. Cl.
CPC .......... *G06F 1/3287* (2013.01); *G06F 1/3296* (2013.01)

(58) Field of Classification Search
None
See application file for complete search history.

(56) References Cited

U.S. PATENT DOCUMENTS

| 6,175,223 B1* | 1/2001 | Martinez | G05F 1/46 323/274 |
| 6,864,708 B2* | 3/2005 | Takahashi | G11C 5/14 326/33 |
| 7,619,402 B1* | 11/2009 | Kwong | G05F 1/575 323/297 |
| 9,000,837 B1* | 4/2015 | Fifield | G11C 29/028 327/306 |
| 2007/0247124 A1* | 10/2007 | Mihashi | H02M 3/1588 323/224 |
| 2008/0116862 A1* | 5/2008 | Yang | G05F 1/575 323/269 |
| 2009/0147603 A1* | 6/2009 | Houston | G11C 11/413 365/203 |
| 2010/0060078 A1* | 3/2010 | Shaw | G05F 1/56 307/31 |

(Continued)

*Primary Examiner* — Nitin Patel
(74) *Attorney, Agent, or Firm* — Buchanan Ingersoll & Rooney, PC

(57) ABSTRACT

The present invention relates to a chip power supply method and a chip, where configuration memory array provides configuration voltage to an NMOS transmission gate, and an LDO circuit supplies power to the chip. The method includes: determining that a working state of the chip switches from a first state to a second state, where the first state and the second state are separately an initial mode, a program mode or a user mode; and adjusting, according to the working state of the chip, a configuration bit to adjust an output voltage of the LDO circuit. The present invention reduces power dissipation of the chip during memory configuration, and improves working performance thereof during the user mode.

9 Claims, 3 Drawing Sheets

Determine that a working state of a chip switches from a first state to a second state, where the first state and the second state are separately an initial mode, a program mode or a user mode — S101

Adjust, according to the working state of the chip, a configuration bit to adjust an output voltage of an LDO circuit — S102

(56) References Cited

U.S. PATENT DOCUMENTS

| | | | |
|---|---|---|---|
| 2011/0181351 A1* | 7/2011 | Young | H03K 19/0016 327/564 |
| 2011/0248688 A1* | 10/2011 | Iacob | G05F 1/575 323/234 |
| 2014/0327470 A1* | 11/2014 | Nazarian | H03K 19/17764 326/38 |
| 2015/0009751 A1* | 1/2015 | Kulkarni | G11O 5/145 365/156 |

* cited by examiner

CHIP POWER SUPPLY METHOD AND CHIP

BACKGROUND

Technical Field

The present invention relates to the technical field of field programmable gate array (Field Programmable Gate Array, FPGA) chips, and in particular, to a chip power supply method and a chip.

Related Art

For a large-scale high performance FPGA chip, a problem of excessively high power dissipation occurs inevitably, and a huge quantity of heat may cause severe and unrecoverable damages to the chip. An FPGA chip has a large quantity of configuration memories inside, and power dissipation of the configuration memories is an importance heat source of the chip. Supply voltage of the configuration memories is generally provided by one or more low-dropout circuits (hereinafter LDOs). In some design, to reduce power dissipation, the configuration memories may be used in slices, and controlled by using multiple LDOs. For configuration memory array that is not used, power supply thereof is switched off, so that data of the configuration memory is lost. In other design, to reduce power dissipation, supply voltage of the configuration memories is reduced. For configuration memory array purely used for data storage, this is a nice method, which can not only reduce the supply voltage, but also facilitate data writing. However, as the configuration memories in the FPGA chip provide gate voltage to a negative channel metal oxide semiconductor (NMOS) pass transistor of the FPGA logic array, an excessively low voltage may lead to decrease of data transmission performance and rate.

FIG. 1 is a timing diagram of a power supply method according to the prior art. As shown in FIG. 1, the existing LDO power supply method includes an initial mode, a program mode and a user mode. Power is a supply voltage; LDO_PDB is a startup signal of an LDO (when LDO_PDB=0, the LDO is turned off; and when LDO_PDB=1, the LDO is turned on); VC is an output voltage of the LDO; cwrite is a write signal of configuration memory array; and cclk is a clock signal.

In the existing timing described above, during the initial mode, program mode and user mode, a stable output voltage VC of 1.2 V is provided to the configuration memory, so that the configuration memory consumes a relatively large current during the program mode, and data transmission performance and rate are not satisfactory during the user mode.

SUMMARY

An objective of the present invention is to provide an FPGA chip configuration method that is based on configuration memory array, so as to resolve the forgoing disadvantages existing in the prior art, thereby achieving extremely low power dissipation during FPGA configuration, and improving working performance during normal operation.

To achieve the foregoing objective, according to a first aspect, the present invention provides a chip power supply method, where configuration memory array provides configuration voltage to an NMOS transmission gate and an LDO circuit supplies power to the chip. The method includes:

determining that a working state of the chip switches from a first state to a second state, where the first state and the second state are separately an initial mode, a program mode or a user mode; and adjusting, according to the working state of the chip, a configuration bit to adjust an output voltage of the LDO circuit.

Preferably, the first state is the initial mode, and the output voltage of the LDO circuit is a first voltage; the second state is the program mode; and the adjusting an output voltage of the LDO circuit includes changing the output voltage of the LDO circuit from the first voltage to a second output voltage.

Preferably, the first state is the program mode, and the output voltage of the LDO circuit is a second voltage; the second state is the user mode; and the adjusting an output voltage of the LDO circuit includes changing the output voltage of the LDO circuit from the second voltage to a third output voltage.

Preferably, the step of adjusting a configuration bit to adjust an output voltage of the LDO circuit specifically includes:

adjusting, by means of adjusting the configuration bit, a resistance value of a variable resistor of the LDO circuit, to control the output voltage of the LDO circuit.

According to a second aspect, the present invention provides a chip, where the chip includes:

an NMOS transmission gate;

configuration memory array, configured to provide configuration voltage to the NMOS transmission gate; and an LDO circuit, configured to supply power to the chip, where, the chip determines that a working state of the chip switches from a first state to a second state, where the first state and the second state are separately an initial mode, a program mode or a user mode; the chip adjusts, according to the working state of the chip, a configuration bit; and the LDO adjusts, according to the configuration bit obtained after the adjusting, an output voltage of the LDO circuit.

Preferably, the first state is the initial mode, and the output voltage of the LDO circuit is a first voltage, the second state is the program mode; and the adjusting an output voltage of the LDO circuit includes changing the output voltage of the LDO circuit from the first voltage to a second output voltage.

Preferably, the first state is the program mode, and the output voltage of the LDO circuit is a second voltage; the second state is the user mode; and the adjusting an output voltage of the LDO circuit includes changing the output voltage of the LDO circuit from the second voltage to a third output voltage.

Preferably, the chip is an FPGA chip.

Preferably, switchover of the working state is implemented by means of chip configuration.

According to the chip power supply method and the chip provided by the present invention, output voltage provided by the LDO circuit to the configuration memory is controlled by means of chip configuration, thereby reducing power dissipation during memory configuration of the chip, and improving working performance during the user mode.

BRIEF DESCRIPTION OF THE DRAWINGS

To describe technical solutions of the embodiments of the present invention more clearly, the following briefly introduces the accompanying drawings required for describing the embodiments of the present invention. Apparently, the accompanying drawings described below merely show some of the embodiments of the present invention. A person of ordinary skill in the art may still obtain other drawings based on these accompanying drawings without creative efforts.

DETAILED DESCRIPTION

The following clearly and completely describes the technical solutions in the embodiments of the present invention with reference to the accompanying drawings in the embodiments of the present invention. Apparently, the described embodiments are only some of the embodiments of the present invention, rather than all of the embodiments. All other embodiments obtained by a person of ordinary skill in the art based on the embodiments of the present invention without creative efforts shall fall within the protection scope of the present invention.

Figure 1:
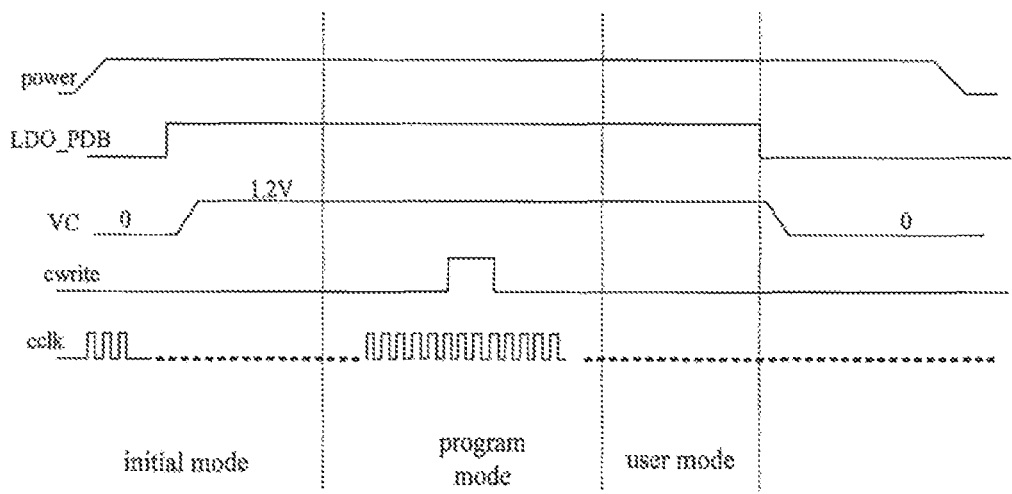
FIG. 1 is a timing diagram of a power supply method according to the prior art.
Figure 2:
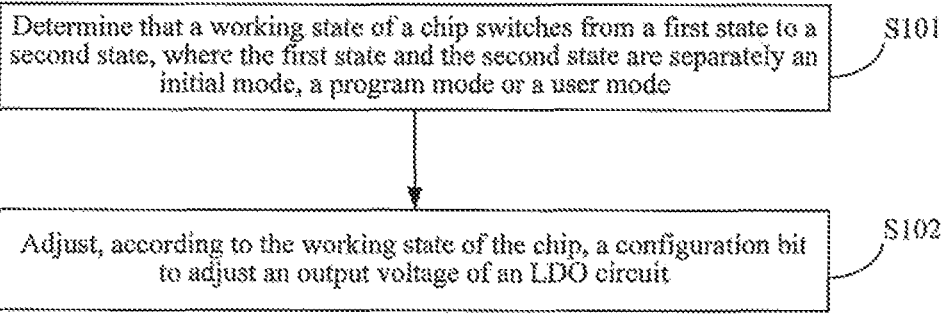
FIG. 2 is a flowchart of a chip power supply method according to an embodiment of the present invention.

FIG. 2 is a flowchart of a chip power supply method provided in an embodiment of the present invention. As shown in FIG. 2, configuration memory array provides configuration voltage to an NMOS transmission gate, and an LDO circuit supplies power to a chip. The method includes:

S101: Determine that a working state of the chip switches from a first state to a second state, where the first state and the second state are separately an initial mode, a program mode or a user mode.

S102: Adjust, according to the working state of the chip, a configuration bit to adjust an output voltage of the LDO circuit.

Specifically, the step of adjusting a configuration bit to adjust an output voltage of the LDO circuit specifically includes:

adjusting, by means of adjusting the configuration bit, a resistance value of a variable resistor of the LDO circuit, to control the output voltage of the LDO circuit.

Specifically, the first state is the initial mode, and the output voltage of the LDO circuit is a first voltage; the second state is the program mode; and the adjusting an output voltage of the LDO circuit includes changing the output voltage of the LDO circuit from the first voltage to a second output voltage.

Specifically, the first state is the program mode, and the output voltage of the LDO circuit is a second voltage; the second state is the user mode; and the adjusting an output voltage of the LDO circuit includes changing the output voltage of the LDO circuit from the second voltage to a third output voltage.

Figure 3:
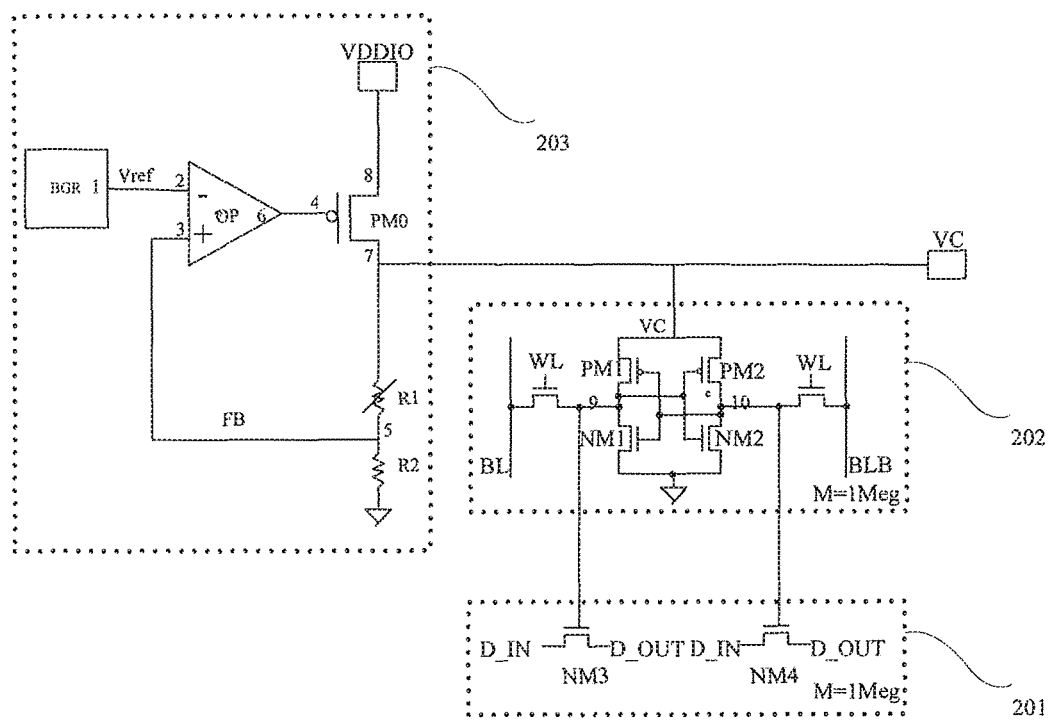
FIG. 3 is a structural diagram of a chip according to an embodiment of the present invention.

FIG. 3 is a structural diagram of a chip provided in an embodiment of the present invention. As shown in FIG. 3, the chip includes:

an NMOS transmission gate 201, configuration memory array 202, configured to provide a configuration bit to the NMOS transmission gate 201; and an LDO circuit 203, configured to supply power to the chip.

It should be noted that, providing supply voltage by using an LDO circuit is a technology that is well known by a person skilled in the art, and the technology has already been described in the description of the prior art. Therefore, details are not described herein again to avoid obscuring the present invention.

The chip determines that a working state of the chip switches from a first state to a second state, where the first state and the second state are separately an initial mode, a program mode or a user mode; the chip adjusts, according to the working state of the chip, a configuration bit; and the LDO circuit 203 adjusts, according to the configuration bit obtained after the adjusting, an output voltage VC of the LDO circuit 203.

It should be noted that, an accurate reference level resistant to PVT is generated by using a band-gap reference BGR, and an operational amplifier OP determines and adjusts an actual output voltage at any time according to different ratios of resistors R1 and R2. A computational formula of the actual output voltage is given as follows:

$VC=V\text{ref}(1+R1/R2)$.

The resistor R1 is a variable resistor, and a change range of the output voltage VC are divided into 8 levels, 1.05 V, 1.1 V, 1.15 V, 1.2 V, 1.25 V, 1.3 V, 1.35 V, and 1.4 V. Adjustment of the output voltage VC is implemented by controlling the variable resistor R1 with a configuration bit LDO_CRL[2:0]. Output voltages corresponding to the configuration bit LDO_CRL[2:0] are shown in Table 1 below.

TABLE 1

| LDO_CRL[2:0] | 1.2 V LDO output voltage control |
|---|---|
| 000 | 1.2 V (default) |
| 001 | 1.25 V |
| 010 | 1.30 V |
| 011 | 1.35 V |
| 100 | 1.40 V |
| 101 | 1.05 V |
| 110 | 1.10 V |
| 111 | 1.15 V |

Specifically, the first state is the initial mode, and the output voltage of the LDO circuit 203 is a first voltage; the second state is the program mode; and the adjusting an output voltage of the LDO circuit 203 includes changing the output voltage of the LDO circuit 203 from the first voltage to a second output voltage.

Specifically, the first state is the program mode, and the output voltage of the LDO circuit 203 is a second voltage; the second state is the user mode; and the adjusting an output voltage of the LDO circuit 203 includes changing the output voltage of the LDO circuit 203 from the second voltage to a third output voltage.

Specifically, the chip is an FPGA chip.

Specifically, switchover of the working state is implemented by means of chip configuration.

Figure 4:
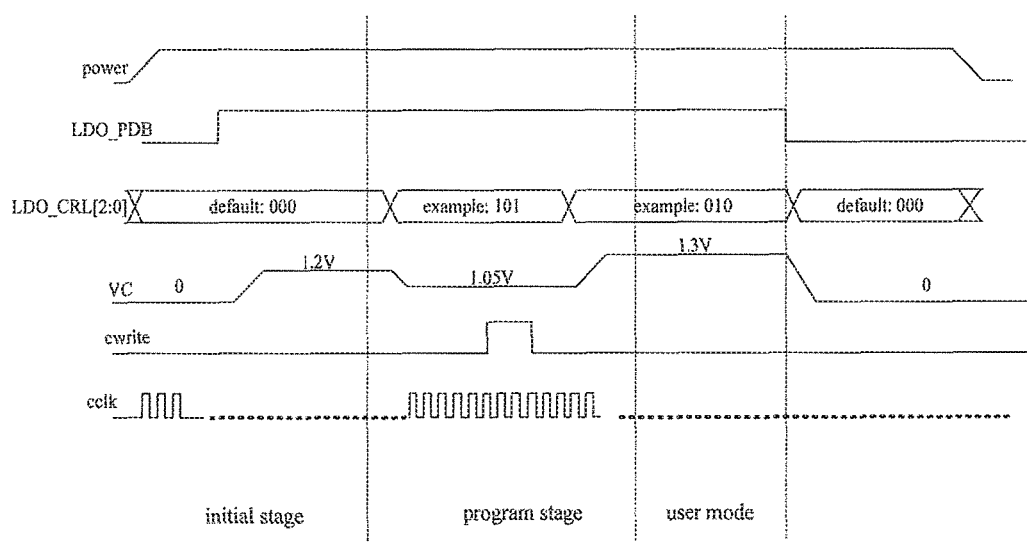
FIG. 4 is a timing diagram of an FPGA chip that uses a power supply method according to an embodiment of the present invention.

FIG. 4 is a timing diagram of an FPGA chip that uses a power supply method provided in an embodiment of the present invention. As shown in FIG. 4, working states of the whole system include an initial mode, a program mode and a user mode.

In this embodiment, description is made by using an example, in which Power is a supply voltage, LDO_PDB is a startup signal of an LDO (when LDO_PDB=0, the LDO is turned off; and when LDO_PDB=1, the LDO is turned on), LDO_CRL[2:0] is used to control an output voltage of the LDO, VC is the output voltage of the LDO, cwrite is a write signal of configuration memory array, and cclk is a clock signal.

Initial Mode:

After the power supply Power is switched on, a band-gap reference BGR and an LDO circuit are subsequently turned on. When the LDO circuit is turned on, all configuration memories are initialized to 0. LDO_CRL[2:0] is set to a default initial value 000, that is, VC=1.2 V.

Program Mode:

An output value of the output voltage VC is changed to 1.05 V by means of configuring LDO_CRL[2:0] to 101. During this phase, a write operation may be performed on the configuration memory, and the required configuration is saved in the configuration memory. At this time, reducing the output voltage VC can reduce an average current and a written peak current of the configuration memory, thereby reducing power dissipation. In addition, reducing the voltage facilitates performing a write operation on the configuration memory.

User Mode

The output value of VC is changed to 1.3 V by means of configuring LDO_CRL[2:0] to 010. During this phase, configuration of the configuration memory has been completed. Improving the output voltage VC can improve gategate voltages of transmission gates NM3 and NM4, thereby ensuring integrity of data transmission.

Figure 5:
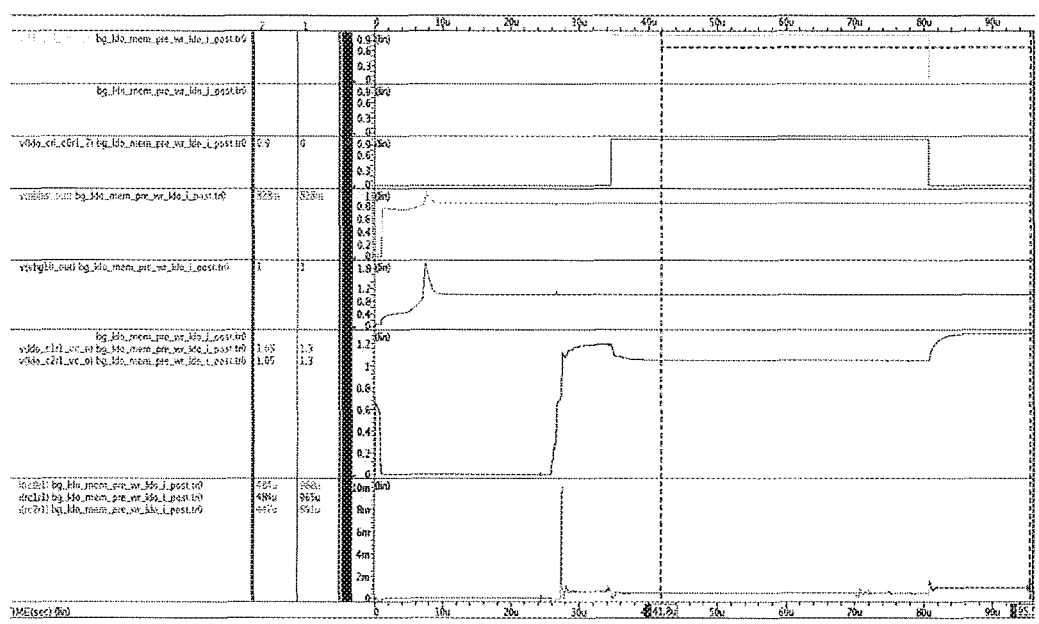
FIG. 5 is a simulation diagram of an FPGA chip that uses a power supply method according to an embodiment of the present invention.

FIG. 5 is a simulation diagram of an FPGA that uses a power supply method according to an embodiment of the present invention. As shown in FIG. 5, through simulation verification, an output voltage VC decreases to 1.05 V during the program mode, so that power dissipation of the configuration is reduced to half of that during the user mode, and the output voltage VC increases to 1.3 V during the user mode, so that data can be kept integral in all cases.

According to the chip power supply method and the chip provided by the present invention, output voltage provided by the LDO circuit to the configuration memory is controlled by means of chip configuration, thereby reducing power dissipation of the chip during memory configuration, and improving working performance of the transmission gate during the user mode.

It may be clearly understood by a person skilled in the art that, for the purpose of convenient and brief description, for a detailed working process of the foregoing system, apparatus and unit, reference may be made to a corresponding process in the foregoing method embodiments, and details are not described herein again.

In the several embodiments provided in the present application, it should be understood that the disclosed system, apparatus, and method may be implemented in other manners. For example, the described apparatus embodiments are merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and the parts displayed as units may or may not be physical units, that is, may be located in one position, or may be distributed on a plurality of network units. A part of or all of the units may be selected according to actual needs to achieve the objectives of the solutions in the embodiments of the present invention.

In addition, functional units in the embodiments of the present invention may be integrated into one processing unit, or each of the units may exist alone physically, or two or more units may be integrated into one unit. The foregoing integrated unit may be implemented in the form of hardware, or may be implemented in the form of a software functional unit.

When the integrated unit is implemented in a form of a software functional module and sold or used as an independent product, the integrated unit may be stored in a computer-readable storage medium. Based on such an understanding, the technical solutions of the present invention essentially, or the part contributing to the prior art, or a part of the technical solutions may be implemented in a form of a software product. The computer software product is stored in a storage medium and includes several instructions for instructing a computer device (which may be a personal computer, a server, a network device, or the like) to perform all or a part of the steps of the methods described in the embodiments of the present invention. The foregoing storage medium includes: any medium that can store program code, such as a USB flash drive, a removable hard disk, a read-only memory (ROM, Read-Only Memory), a random access memory (RAM, Random Access Memory), a magnetic disk, or an optical disc.

The foregoing descriptions are merely specific embodiments of the present invention, but are not intended to limit the protection scope of the present invention. Any equivalent variation or replacement readily figured out by a person skilled in the art within the technical scope disclosed in the present invention shall fall within the protection scope of the present invention. Therefore, the protection scope of the present invention shall be subject to the appended claims.

What is claimed is:

1. A chip power supply method, wherein a configuration memory array provides a configuration voltage to a negative channel metal oxide semiconductor (NMOS) transmission gate via an NMOS drain of the configuration memory, and a low-dropout (LDO) circuit supplies power to the configuration memory and the chip, the method comprising:

determining that a working state of the chip has switched from a first state to a second state, wherein the first state and the second state are each one of an initial mode, a program mode, or a user mode;

when the working state changes, adjusting, according to the working state of the chip, a configuration bit provided to the LDO circuit; and adjusting, based on the adjusted configuration bit, an output voltage of the LDO circuit output to the configuration memory and to the chip.

2. The method according to claim 1, wherein, the first state is the initial mode, and the output voltage of the LDO circuit is a first voltage;

the second state is the program mode; and the adjusting an output voltage of the LDO circuit comprises changing the output voltage of the LDO circuit from the first voltage to a second output voltage.

3. The method according to claim 1, wherein, the first state is the program mode, and the output voltage of the LDO circuit is a second voltage;

the second state is the user mode; and the adjusting an output voltage of the LDO circuit comprises changing the output voltage of the LDO circuit from the second voltage to a third output voltage.

4. The method according to claim 1, wherein the adjusting a configuration bit to adjust an output voltage of the LDO circuit specifically comprises:

adjusting, by means of adjusting the configuration bit, a resistance value of a variable resistor of the LDO circuit, to control the output voltage of the LDO circuit.

5. A chip comprising:
a negative channel metal oxide semiconductor (NMOS) transmission gate;
a configuration memory array configured to provide a configuration voltage to the NMOS transmission gate via an NMOS drain of the configuration memory; and
a low-dropout (LDO) circuit configured to supply power to the configuration memory and the chip,
wherein, when the chip determines that a working state of the chip switches from a first state to a second state, wherein the first state and the second state are each one of an initial mode, a program mode, or a user mode, the chip adjusts, according to the working state of the chip, a configuration bit provided to the LDO circuit, and the LDO adjusts, according to the configuration bit obtained after the adjusting, an output voltage of the LDO circuit output to the configuration memory and to the chip.

6. The chip according to claim 5, wherein,
the first state is the initial mode, and the output voltage of the LDO circuit is a first voltage;
the second state is the program mode; and
the adjusting an output voltage of the LDO circuit comprises changing the output voltage of the LDO circuit from the first voltage to a second output voltage.

7. The chip according to claim 5, wherein,
the first state is the program mode, and the output voltage of the LDO circuit is a second voltage;
the second state is the user mode; and
the adjusting an output voltage of the LDO circuit comprises changing the output voltage of the LDO circuit from the second voltage to a third output voltage.

8. The chip according to claim 5, wherein the chip is A Field Programmable Gate Array (FPGA) chip.

9. The chip according to claim 5, wherein switchover of the working state is implemented by means of chip configuration.

* * * * *